United States Patent [19]

Hattori et al.

[11] 4,247,951
[45] Jan. 27, 1981

[54] FREQUENCY SYNTHESIZER WITH UNAUTHORIZED FREQUENCY INHIBITING MEANS

[75] Inventors: Keisuke Hattori, Sunnyvale; Alexander R. Sabo, San Carlos, both of Calif.

[73] Assignee: Micro Power Systems, Inc., Santa Clara, Calif.

[21] Appl. No.: 956,279

[22] Filed: Oct. 31, 1978

[51] Int. Cl.³ .................. H04B 1/26; H03L 7/18
[52] U.S. Cl. ...................... 455/183; 455/77; 455/166
[58] Field of Search ............ 325/464, 470, 25; 331/1 A; 455/165, 166, 183

[56] References Cited

U.S. PATENT DOCUMENTS

| | | | |
|---|---|---|---|
| 3,949,304 | 4/1976 | McClaskey | 331/1 A |
| 3,962,644 | 6/1976 | Baker | 325/465 |
| 3,968,444 | 7/1976 | Tenny | 325/470 |
| 4,065,720 | 12/1977 | Pogue, Jr. | 325/25 |
| 4,109,283 | 8/1978 | Rast | 325/470 |
| 4,123,717 | 10/1978 | Yiu et al. | 325/470 |
| 4,149,125 | 4/1979 | Ikeguchi et al. | 325/25 |

OTHER PUBLICATIONS

Malartic & Leclerc "VHF Radio Telephone with LSI Synthesizer"; Philips Telecommunication Review, vol. 36, No. 1, 4/78.

Primary Examiner—Marc E. Bookbinder
Attorney, Agent, or Firm—Flehr, Hohbach, Test

[57] ABSTRACT

A radio which has assigned frequencies or channels for operation is prevented from operating on other channels. The frequency synthesizer in the radio is a large scale integrated circuit in a single semiconductor chip which is controlled by input codes from channel select switches. The synthesizer includes circuitry which responds to input codes for illegal channels and produces an inhibit signal thereby preventing generation of unauthorized frequencies. The circuitry may include a read only memory which is addressed by the input code. Alternatively, logic circuitry may be provided which responds to codes for illegal channels. Due to the circuitry being in integrated form, the method of inhibiting unauthorized signal generation cannot be easily circumvented.

4 Claims, 4 Drawing Figures

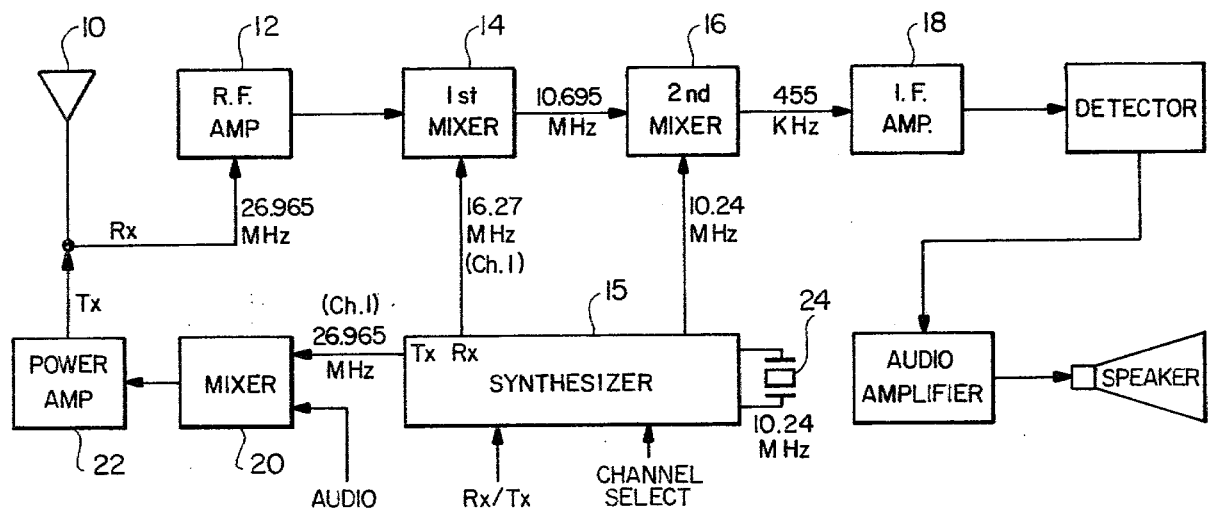
FIG_1
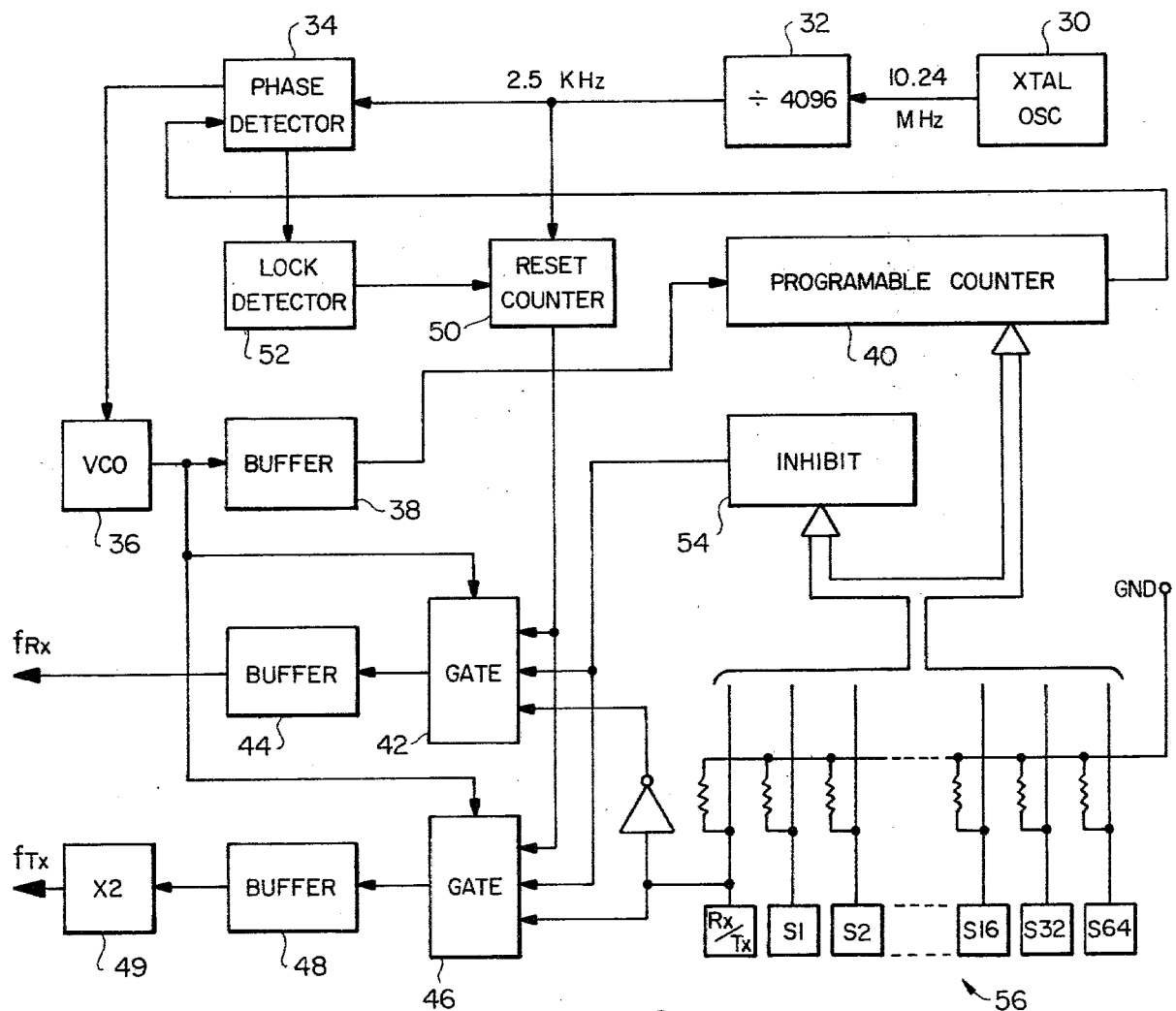
FIG_2

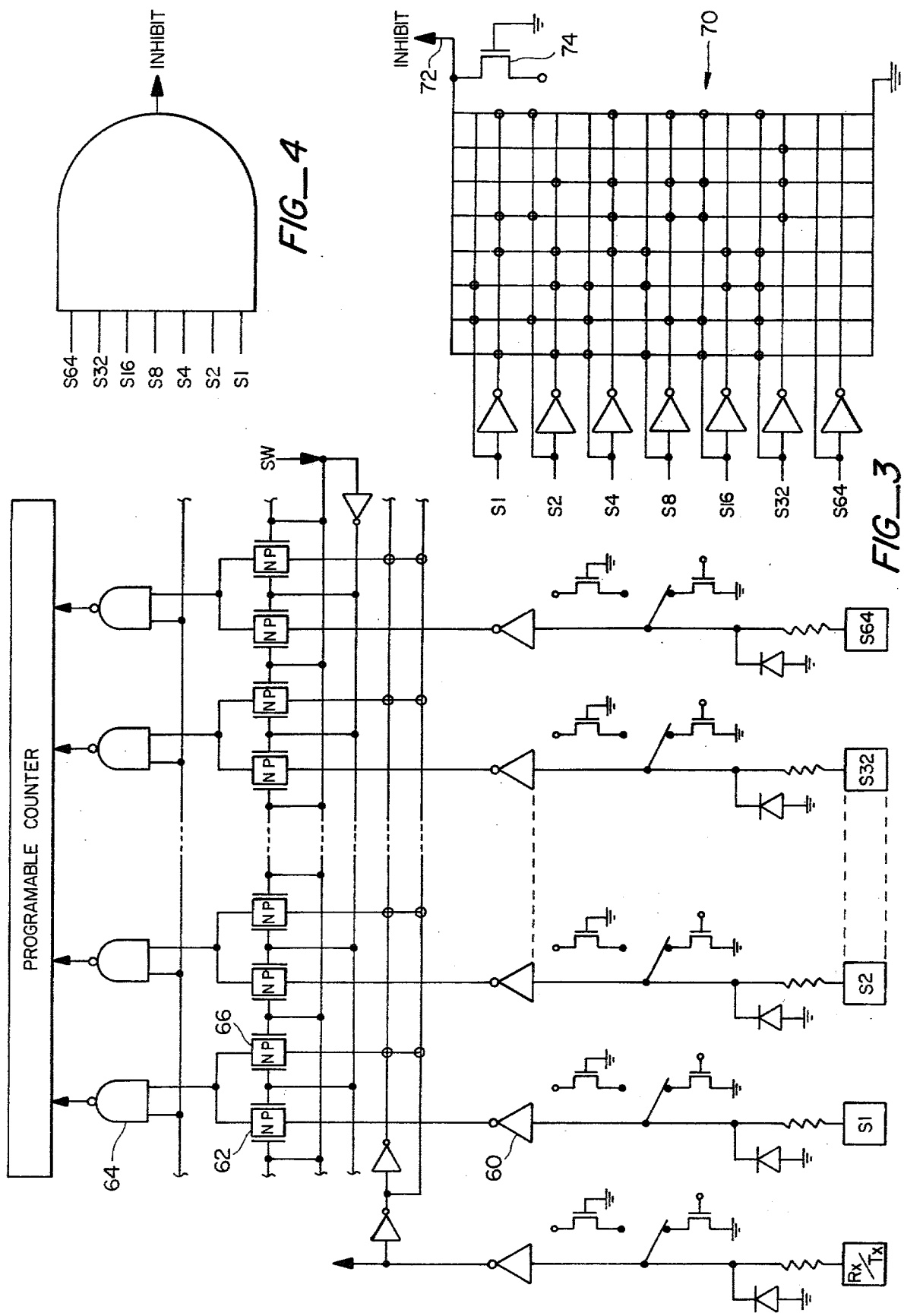

FREQUENCY SYNTHESIZER WITH UNAUTHORIZED FREQUENCY INHIBITING MEANS

BACKGROUND OF THE INVENTION

This invention relates generally to radio frequency signal transmission and reception, and more particularly the invention relates to frequency synthesis circuitry used in radio transmitters and receivers.

The radio transmission of electrical signals involves modulation of a propagated carrier signal by a lower frequency signal containing the intelligence to be transmitted. Because of the crowded use of the radio frequency spectrum, certain frequency ranges are designated for particular users. For example, citizens band (CB) radio has been assigned forty transmission frequencies, or channels, in the range of 26.9 to 27.5 megahertz (MHz).

Typically, the frequency synthesizer in a CB radio is controlled by switch means whereby the various frequencies or channels are selected for transmission and reception of radio waves. However, the synthesizers are capable of generating frequencies other than the assigned frequencies, and by alterating the switch means a CB radio can be used for transmission on unassigned or illegal channels. This can create interference with other RF signals, particularly television signals.

SUMMARY OF THE INVENTION

An object of the present invention is an improved radio transmitter/receiver having designated frequency capabilities.

Another object of the invention is a frequency synthesizer for use in a radio transmitter/receiver in which only designated frequencies can be generated.

Yet another object of the invention is a frequency synthesizer which can be implemented in a single integrated circuit chip and wherein frequency is selected by circuitry in the integrated circuit chip.

Another object of the invention is a method of inhibiting unauthorized signal generation which cannot be easily circumvented.

A feature of the invention is circuitry which is responsive to switch selections for unauthorized frequencies and produces a signal for inhibiting operation of the frequency synthesizer.

Briefly, a radio transmitter/receiver in accordance with the invention includes a frequency synthesizer for generating transmit and receive frequencies for designated channels of operation. Frequency selection is determined by external switches or control logic, and unassigned frequency selections are inhibited by circuitry which recognizes an unassigned frequency selection and in response thereto generates an inhibit signal. Advantageously, the circuit is part of an integrated circuit and cannot be modified to allow unauthorized frequency transmission and reception.

The invention and objects and features thereof will be more readily apparent from the following detailed description and appended claims when taken with the drawing.

BRIEF DESCRIPTION OF THE DRAWING

FIG. 1 is a functional block diagram of a radio transmitter and receiver.

FIG. 2 is a functional block diagram of a frequency synthesizer in accordance with the present invention.

FIG. 3 is an electrical schematic of a portion of the frequency synthesizer of FIG. 2 further illustrating the inhibiting circuitry.

FIG. 4 is a schematic of logic circuitry for detecting an unauthorized frequency and generating an inhibit signal.

DETAILED DESCRIPTION OF THE ILLUSTRATED EMBODIMENT

Referring now to the drawing, FIG. 1 is a functional block diagram of the conventional superheterodyne radio transmitter/receiver in which a frequency synthesizer in accordance with the present invention may be employed. The radio transmitter/receiver and the synthesizer in accordance with the present invention will be described for a citizen's band (CB) application. However, it will be appreciated that the invention may be employed in other radio transmission and reception systems.

Propagated radio waves are received and transmitted from an antenna 10. A received radio signal is applied to an amplifier 12 to increase the power of the received wave for further use in the receiver. The amplified wave is applied to a first mixer 14 which mixes the received wave and injection signal with the frequency difference between the two signals applied as the input to a second mixer 16. The frequency of the injection signal which is applied to the first mixer 14 is chosen to correspond to a designated channel of radio wave transmission. For example, channel 1 in CB radio is at a frequency of 26.965 megahertz. By mixing a frequency of 16.27 megahertz with the received channel 1 frequency, an output signal at 10.695 MHz, or the difference between the two input frequencies, is generated. Typically, the injection signal frequency is chosen so that the frequency difference between the reference frequency and the desired channel received signal will always be a fixed frequency (e.g. 10.695 MHz in this embodiment) to be applied to the second mixer.

The output from the first mixer is applied to the second mixer 16 along with a fixed reference frequency of 10.24 MHz, and the difference frequency output from the second mixer, 455 kilohertz, is applied to an IF amplifier 18. The output of the IF amplifier is then applied to a detector, audio amplifier, and speaker, as shown.

In the transmit operation, a signal from the frequency synthesizer is applied to a mixer 20 along with the audio signal, and the modulated carrier signal from mixer 20 is applied through a power amplifier 22 to antenna 10 for propagation.

In accordance with one embodiment of the invention, synthesizer 15 receives channel select signals and a receive/transmit ($R_x/T_x$) signal and generates either a transmit signal ($T_x$) or receive signal ($R_x$) in accordance with the selected channel. An external crystal 24 is connected to the synthesizer for generating a precise 10.24 MHz signal, which is applied as an input to the second mixer 16 and also used in a phase locked loop as the reference frequency.

Referring now to FIG. 2, a functional block diagram of one embodiment of the frequency synthesizer 15 of FIG. 1 is illustrated. Importantly, all of the circuitry illustrated in FIG. 2, except for the crystal used in the crystal oscillator and the input switches, can be provided in a single large scale integrated circuit chip. The synthesizer includes a crystal oscillator 30 (with external crystal) which generates a 10.240 MHz signal. The signal is applied to a divider 32 which divides the frequency down to 2.5 kilohertz or other covenant frequencies which is applied as a reference signal to phase detector 34. The other input to phase detector 34 is derived from the voltage controlled oscillator (VCO) 36. VCO 36 generates an output signal which is applied through buffer 38 to a programmable counter 40 with the output from programmable counter 40 applied as the other input to phase detector 34. Phase detector 34 compares the 2.5 kilohertz reference signal to the divided output signal from VCO 36, and in response thereto generates a control voltage which is applied to control the frequency of VCO 36. The output of VCO 36 is also applied through gate 42 and buffer 44 as the receiver frequency ($f_{Rx}$) and through gate 46, buffer 48, and doubler 49 as the transmitter frequency ($f_{Tx}$).

The 2.5 kilohertz signal from divider 32 is applied also through a six bit counter 50 as one control input to gates 42 and 46. Counter 50 has a reset terminal which is controlled by a lock detector 52 which enables the counter only upon determination of phase lock within phase detector 34. Thus, gates 42 and 46 are enabled only when phase lock has been detected by detector 52. Gates 42 and 46 are also controlled by a signal from inhibit generator 54 which generates an inhibit signal in response to an illegal channel input from the manually set switches shown generally at 56. Further, gate 42 is enabled only in response to a receive ($R_x$) signal, and gate 46 is enabled only in response to a transmit ($T_x$) signal.

In accordance with the present invention, the Inhibit generator 54 is an integral part of the integrated circuit chip for the synthesizer and cannot be reconnected to allow synthesizer operation for illegal channels. Thus, an operator cannot bypass the controlled circuitry for operation on unassigned channels by modification of the external circuitry, as has been permitted in prior art transmitters and receivers. Preferably, the Inhibit generator comprises a read-only memory (ROM) which is addressed by the channel selector. However, other logic circuitry can be utilized to recognize illegal channels and produce an Inhibit signal.

FIG. 3 is an electrical schematic of a portion of the synthesizer shown in FIG. 2 and further illustrates the Inhibit generator which responds to an illegal channel selection. The input switches S1–S64 are implemented using MOS circuitry with each switch being applied through an inverter 60 and transmission gate 62 to a NAND gate 64. The output of the NAND gate is connected to one stage of the programmable counter to effect a desired frequency count in response to the switch input settings. So that the programmable counter will respond to the same switch input settings for either transmit or receive signal generation, the $R_x$ and $T_x$ signals are also applied through transmission gates 66 and the NAND gate 64 to the programmable counter to achieve the necessary count offset for receive and transmit frequencies for each channel. The other input to each of the NAND gates is provided by suitable feedback from the programmable counter to effect a desired frequency for the particular synthesizer application. Operation of the transmission gate 62, 66 is in response to a switch signal SW derived from the programmable counter. The interconnections of the switch input signals and the programmable counter for the required frequencies are heretofore known in the art and not discussed further.

The generator for the Inhibit signal comprises the read only memory matrix shown generally at 70 which receives as input the signal and its complement from each switch. A positive voltage signal is normally applied to the Inhibit output 72 by P channel transistor 74. Only in response to the unauthorized channels, as determined by the ROM matrix interconnect pattern, will the Inhibit signal be applied by application of the ground potential through the matrix to the Inhibit line.

The Inhibit signal can be applied directly to the gate 42 and 46 as shown in FIG. 2, or alternatively the Inhibit signal can be applied to the Lock Detector 52 or counter 50 to inhibit radio operation.

In one embodiment of the invention a single chip synthesizer designated the MPS 7189, commercially available from the present assignee, the transmitter frequency ($F_{tx}$) and a receiver frequency ($F_{rx}$) for the 40 channels of a CB radio are given by the following coding diagram:

| Illegal Channels | $f_{Tx}$ (MHz) | CH. | S 32 | S 16 | S 8 | S 4 | S 2 | S 1 | $f_{Rx}$** |
|---|---|---|---|---|---|---|---|---|---|
| | 26.965 | 1 | 0 | 0 | 0 | 0 | 0 | 0 | 16.270 |
| | .975 | 2 | 0 | 0 | 0 | 0 | 0 | 1 | .280 |
| | .985 | 3 | 0 | 0 | 0 | 0 | 1 | 0 | .290 |
| 0 | .995 | | 0 | 0 | 0 | 0 | 1 | 1 | .300 |
| | 27.005 | 4 | 0 | 0 | 0 | 1 | 0 | 0 | .310 |
| | .015 | 5 | 0 | 0 | 0 | 1 | 0 | 1 | .320 |
| | .025 | 6 | 0 | 0 | 0 | 1 | 1 | 0 | .330 |
| | .035 | 7 | 0 | 0 | 0 | 1 | 1 | 1 | .340 |
| 0 | .045 | | 0 | 0 | 1 | 0 | 0 | 0 | .350 |
| | .055 | 8 | 0 | 0 | 1 | 0 | 0 | 1 | .360 |
| | .065 | 9 | 0 | 0 | 1 | 0 | 1 | 0 | .370 |
| | .075 | 10 | 0 | 0 | 1 | 0 | 1 | 1 | .380 |
| | .085 | 11 | 0 | 0 | 1 | 1 | 0 | 0 | .390 |
| 0 | .095 | | 0 | 0 | 1 | 1 | 0 | 1 | .400 |
| | .105 | 12 | 0 | 0 | 1 | 1 | 1 | 0 | .410 |
| | .115 | 13 | 0 | 0 | 1 | 1 | 1 | 1 | .420 |
| | .125 | 14 | 0 | 1 | 0 | 0 | 0 | 0 | .430 |
| | .135 | 15 | 0 | 1 | 0 | 0 | 0 | 1 | .440 |
| 0 | .145 | | 0 | 1 | 0 | 0 | 1 | 0 | .450 |
| | .155 | 16 | 0 | 1 | 0 | 0 | 1 | 1 | .460 |
| | .165 | 17 | 0 | 1 | 0 | 1 | 0 | 0 | .470 |
| | .175 | 18 | 0 | 1 | 0 | 1 | 0 | 1 | .480 |
| | .185 | 19 | 0 | 1 | 0 | 1 | 1 | 0 | .490 |
| 0 | .195 | | 0 | 1 | 0 | 1 | 1 | 1 | .500 |
| | .205 | 20 | 0 | 1 | 1 | 0 | 0 | 0 | .510 |
| | .215 | 21 | 0 | 1 | 1 | 0 | 0 | 1 | .520 |
| | .225 | 22 | 0 | 1 | 1 | 0 | 1 | 0 | .530 |
| | .235 | 24 | 0 | 1 | 1 | 0 | 1 | 1 | .540 |
| | .245 | 25 | 0 | 1 | 1 | 1 | 0 | 0 | .550 |
| | .255 | 23 | 0 | 1 | 1 | 1 | 0 | 1 | .560 |
| | .265 | 26 | 0 | 1 | 1 | 1 | 1 | 0 | .570 |
| | .275 | 27 | 0 | 1 | 1 | 1 | 1 | 1 | .580 |
| | .285 | 28 | 1 | 0 | 0 | 0 | 0 | 0 | .590 |
| | .295 | 29 | 1 | 0 | 0 | 0 | 0 | 1 | .600 |
| | .305 | 30 | 1 | 0 | 0 | 0 | 1 | 0 | .610 |
| | .315 | 31 | 1 | 0 | 0 | 0 | 1 | 1 | .620 |
| | .325 | 32 | 1 | 0 | 0 | 1 | 0 | 0 | .630 |
| | .335 | 33 | 1 | 0 | 0 | 1 | 0 | 1 | .640 |
| | .345 | 34 | 1 | 0 | 0 | 1 | 1 | 0 | .650 |
| | .355 | 35 | 1 | 0 | 0 | 1 | 1 | 1 | .660 |
| | .365 | 36 | 1 | 0 | 1 | 0 | 0 | 0 | .670 |
| | .375 | 37 | 1 | 0 | 1 | 0 | 0 | 1 | .680 |
| | .385 | 38 | 1 | 0 | 1 | 0 | 1 | 0 | .690 |
| | .395 | 39 | 1 | 0 | 1 | 0 | 1 | 1 | .700 |
| | 27.405 | 40 | 1 | 0 | 1 | 1 | 0 | 0 | 16.710 |
| 0 | | | 1 | 0 | 1 | 1 | 0 | 1 | |
| 0 | | | 1 | 0 | 1 | 1 | 1 | 0 | |
| 0 | | | 1 | 0 | 1 | 1 | 1 | 1 | |
| 0 | | | 1 | 1 | 0 | 0 | 0 | 0 | |
| 0 | | | 1 | 1 | x | x | x | x | |

-continued

| Illegal Channels | $f_{Tx}$ (MHz) | CH. | SWITCH CODE | | | | | | $f_{RX}$** |
|---|---|---|---|---|---|---|---|---|---|
| | | | S 32 | S 16 | S 8 | S 4 | S 2 | S 1 | |
| 0* | | | 1 | 1 | 1 | 1 | 1 | 1 | |

*Illegal channels designated by 0 are inhibited when addressed.
**frx frequencies shown for example only; other frequencies may be used.

From the above table it will be seen that the six binary input switches can address more than the forty authorized channels. For example, the switch code 000011 between the codes for authorized channels 3 and 4 is illegal and operation of the synthesizer in response thereto is inhibited. As an alternative to the ROM in FIG. 3, a logic circuit comprising AND gate 78 in FIG. 4 can respond to the code to generate an Inhibit signal. Similar logic circuits can be provided for the other unauthorized codes.

A frequency synthesizer including inhibit circuit means in accordance with the present invention has proved successful in a CB radio application wherein only the 40 authorized channel codes can be utilized. Due to the Inhibit generating means being integral to the synthesizer integrated circuit, an operator is unable to bypass or reconnect the circuitry to permit unauthorized operation of a radio.

It will be appreciated that the frequencies generated by the synthesizer are determined not only by the authorized or assigned frequencies but also by the radio manufacturer's specification for mixer frequencies.

While the invention has been described with reference to specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A frequency synthesizer for generating authorized signals and inhibiting unauthorized signals comprising:
   a reference frequency source,
   a voltage controlled oscillator,
   a phase detector,
   means connecting said reference frequency source to an input to said phase detector,
   means including a programmable counter connecting said voltage controlled oscillator to an input to said phase detector,
   means connecting an output signal from said phase detector to a control terminal of said voltage controlled oscillator,
   frequency selector means operably connected to said programmable counter for controlling the oscillation frequency of said voltage controlled oscillator,
   output gate means connected to said voltage controlled oscillator; and
   means for inhibiting said output gate means when said frequency selector means selects an unauthorized frequency, said means comprising a read only memory which provides a first inhibit signal when said frequency selector means indicates an unauthorized frequency.

2. A frequency synthesizer as defined by claim 1 wherein said frequency selector means comprises a plurality of switches and a plurality of transfer gates wherein said transfer gates connect said plurality of switches to said programmable counter whereby said switches operably control said programmable counter.

3. A frequency synthesizer as defined by claim 1 wherein said frequency synthesizer comprises a large scale integrated circuit chip.

4. A frequency synthesizer as defined by claim 1 wherein said output gate means includes an inhibit terminal for receiving a second inhibit signal when said phase detector is not phase locked, and wherein said second inhibit signal further inhibits generation of unauthorized frequencies.

* * * * *